United States Patent
Chang

(10) Patent No.: US 10,121,757 B2
(45) Date of Patent: Nov. 6, 2018

(54) PILLAR STRUCTURE AND MANUFACTURING METHOD THEREOF

(71) Applicant: Unimicron Technology Corp., Taoyuan (TW)

(72) Inventor: Cheng-Jui Chang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 37 days.

(21) Appl. No.: 14/953,020

(22) Filed: Nov. 27, 2015

(65) Prior Publication Data

US 2017/0110431 A1 Apr. 20, 2017

(30) Foreign Application Priority Data

Oct. 19, 2015 (TW) .............................. 104134172 A

(51) Int. Cl.
*H01L 23/00* (2006.01)
*H05K 1/00* (2006.01)

(52) U.S. Cl.
CPC .............. *H01L 24/45* (2013.01); *H01L 24/05* (2013.01); *H01L 24/13* (2013.01); *H01L 24/85* (2013.01); *H05K 1/00* (2013.01); *H01L 2224/13007* (2013.01); *H01L 2224/13026* (2013.01); *H01L 2224/4502* (2013.01); *H01L 2224/45005* (2013.01); *H01L 2224/45015* (2013.01); *H01L 2224/8592* (2013.01)

(58) Field of Classification Search
CPC ......... H01L 24/45; H01L 24/00; H01L 24/05; H01L 24/10; H01L 2224/13016; H01L 2224/1302

See application file for complete search history.

(56) References Cited

U.S. PATENT DOCUMENTS

| 6,413,851 | B1 * | 7/2002 | Chow | ................. H01L 21/2885 257/E21.175 |
| 6,653,235 | B2 * | 11/2003 | Liang | ..................... H01L 24/11 257/E21.508 |
| 8,232,192 | B2 * | 7/2012 | Lin | ....................... H01L 21/563 257/778 |

(Continued)

FOREIGN PATENT DOCUMENTS

| CN | 102456651 | 5/2012 |
| TW | I345433 | 7/2011 |
| TW | I362096 | 4/2012 |

OTHER PUBLICATIONS

"Office Action of Taiwan Counterpart Application", dated Oct. 3, 2016, p. 1-p. 4, in which the listed reference was cited.

*Primary Examiner* — Syed Gheyas
*Assistant Examiner* — S. M. S Imtiaz
(74) *Attorney, Agent, or Firm* — JCIPRNET

(57) ABSTRACT

A pillar structure is disposed on a substrate. The pillar structure includes a pad, a metal wire bump, a metal wire, and a metal plating layer. The pad is disposed on the substrate. The metal wire bump is disposed on the pad. The metal wire is connected to the metal wire bump. The metal wire extends in a first extension direction, the substrate extends in a second extension direction, and the first extension direction is perpendicular to the second extension direction. The metal plating layer covers the pad and completely encapsulates the metal wire bump and the metal wire.

6 Claims, 3 Drawing Sheets

(56) References Cited

U.S. PATENT DOCUMENTS

| | | | | |
|---|---|---|---|---|
| 2006/0244140 | A1* | 11/2006 | Hu | H01L 21/4853 257/737 |
| 2008/0113504 | A1* | 5/2008 | Lee | H01L 24/15 438/614 |
| 2009/0096092 | A1* | 4/2009 | Patel | H01L 24/11 257/737 |
| 2011/0003470 | A1* | 1/2011 | Burgess | H01L 24/11 438/614 |
| 2012/0313239 | A1* | 12/2012 | Zohni | H01L 24/81 257/737 |
| 2013/0068514 | A1* | 3/2013 | Hsu | H01L 21/563 174/259 |
| 2014/0008814 | A1* | 1/2014 | Chen | H01L 23/481 257/774 |
| 2014/0124927 | A1* | 5/2014 | Lin | H01L 21/4846 257/738 |
| 2014/0346669 | A1* | 11/2014 | Wang | H01L 24/13 257/737 |
| 2015/0021751 | A1* | 1/2015 | Paek | H01L 23/49582 257/676 |
| 2015/0137353 | A1* | 5/2015 | Wirz | H01L 23/481 257/737 |
| 2015/0214175 | A1* | 7/2015 | Kiyono | H01L 24/81 257/737 |
| 2015/0294949 | A1* | 10/2015 | Lin | H01L 23/49816 257/738 |
| 2015/0380371 | A1* | 12/2015 | Chang | H01L 24/11 438/614 |
| 2016/0056055 | A1* | 2/2016 | Ko | H01L 25/50 438/107 |
| 2016/0148888 | A1* | 5/2016 | Ryu | H01L 24/14 257/621 |

* cited by examiner

PILLAR STRUCTURE AND MANUFACTURING METHOD THEREOF

CROSS-REFERENCE TO RELATED APPLICATION

This application claims the priority benefit of Taiwan application serial no. 104134172, filed on Oct. 19, 2015. The entirety of the above-mentioned patent application is hereby incorporated by reference herein and made a part of this specification.

TECHNICAL FIELD

The disclosure relates to a pillar structure and a manufacturing method thereof. More particularly, the disclosure relates to a pillar structure made of metal and a manufacturing method of the pillar structure.

DESCRIPTION OF RELATED ART

In the existing process of circuit boards, plural copper pillars are often made all together through copper plating. The required height of the copper pillars is about 150 micrometers; during the plating process, it is rather difficult to maintain the consistency of the height of the copper pillars due to manufacturing variations, and thus the copper pillars with the consistent heights cannot be made with ease. In addition, the copper pillars formed by copper plating requires long manufacturing time and high manufacturing costs, and the copper plating process also causes difficulties in mass production of such copper pillars.

SUMMARY

The disclosure is directed to a pillar structure which can be manufactured efficiently and a manufacturing method of the pillar structure which reduces the manufacturing time; in addition, the height of resultant pillar structures can be easily controlled.

In an embodiment of the disclosure, a pillar structure disposed on a substrate is provided. The pillar structure includes a pad, a metal wire bump, a metal wire, and a metal plating layer. The pad is disposed on the substrate. The metal wire bump is disposed on the pad. The metal wire is connected to the metal wire bump, and the metal wire and the metal wire bump are integrally formed. Here, the metal wire extends in a first extension direction, the substrate extends in a second extension direction, and the first extension direction is perpendicular to the second extension direction. The metal plating layer covers the pad and completely encapsulates the metal wire bump and the metal wire.

According to an embodiment of the disclosure, an orthogonal projection of the metal wire bump on the substrate and an orthogonal projection of the pad on the substrate are completely overlapped, and an area of the orthogonal projection of the metal wire bump on the substrate is smaller than an area of the orthogonal projection of the pad on the substrate.

According to an embodiment of the disclosure, a length of the metal wire is ⅘ a length of the metal plating layer.

According to an embodiment of the disclosure, a diameter of the metal wire is within a range from 15 micrometers to 200 micrometers.

According to an embodiment of the disclosure, the metal plating layer covers an upper surface of the pad and encapsulates a side surface of the pad connecting the upper surface.

According to an embodiment of the disclosure, an edge of the metal plating layer is aligned to a side surface of the pad.

In an embodiment of the disclosure, a manufacturing method of a pillar structure includes following steps. A pad is formed on a substrate. A wire bonding process is performed to form a metal wire bump and a metal wire on the pad. The metal wire bump is located on the pad, the metal wire is connected to the metal wire bump and extends in a first extension direction, the substrate extends in a second extension direction, and the first extension direction of the metal wire is perpendicular to the second extension direction of the substrate. A plating process is performed to form a metal plating layer with use of the pad, the metal wire bump, and the metal wire as a plating seed layer, so as to cover the pad and completely encapsulate the metal wire bump and the metal wire.

According to an embodiment of the disclosure, the metal plating layer covers an upper surface of the pad and encapsulates a side surface of the pad connecting the upper surface.

According to an embodiment of the disclosure, the manufacturing process further includes: forming a patterned photoresist layer on the substrate before performing the wire bonding process, wherein the patterned photoresist layer exposes the pad; removing the patterned photoresist layer after performing the plating process, so as to expose an edge of the metal plating layer, wherein the edge of the metal plating layer is aligned to a side surface of the pad.

According to an embodiment of the disclosure, an orthogonal projection of the metal wire bump on the substrate and an orthogonal projection of the pad on the substrate are completely overlapped, and an area of the orthogonal projection of the metal wire bump on the substrate is smaller than an area of the orthogonal projection of the pad on the substrate.

According to an embodiment of the disclosure, a length of the metal wire is ⅘ a length of the metal plating layer.

According to an embodiment of the disclosure, a diameter of the metal wire is within a range from 15 micrometers to 200 micrometers.

In view of the above, the metal wire bump and the metal wire are formed on the pad through wire bonding, and the metal plating layer is then formed through plating with use of the pad, the metal wire bump, and the metal wire as the plating seed layer, so as to form the pillar structure. Through applying the manufacturing method of the pillar structure provided herein, the pillar structure made of metal can be formed efficiently, and the height of the resultant pillar structure can be controlled by adjusting the length of the metal wire. Hence, the pillar structure formed by conducting the manufacturing method provided herein can have the consistent height and can be characterized by simple production and low manufacturing costs.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
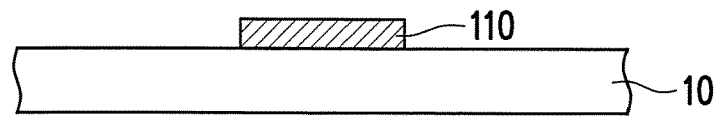
FIG. 1A to FIG. 1C are schematic cross-sectional diagrams illustrating a manufacturing method of a pillar structure according to an embodiment of the disclosure.
Figure 1B:
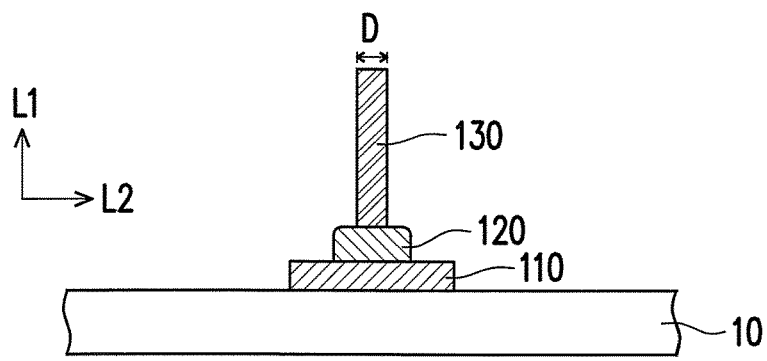
Figure 1C:
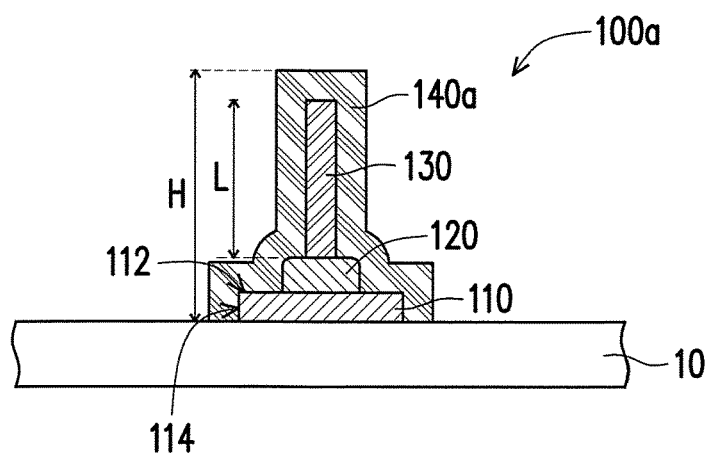

FIG. 1A to FIG. 1C are schematic cross-sectional diagrams illustrating a manufacturing method of a pillar structure according to an embodiment of the disclosure. With reference to FIG. 1A, in the manufacturing method of the pillar structure provided herein, a pad 110 is formed on a substrate 10. Here, a material of the pad 110 is, for instance, copper, gold, silver, aluminum, nickel, tin, or an alloy of some or all of the above, and the substrate 10 is a circuit board or a package substrate, for instance, which should not be construed as limitations to the disclosure.

With reference to FIG. 1B, a wire bonding process is performed to form a metal wire bump 120 and a metal wire 130 on the pad 110. The metal wire bump 120 is formed on the pad 110 through applying a high voltage discharge technique, the metal wire 130 is connected to the metal wire bump 120 and extends in a first extension direction L1, the substrate 10 extends in a second extension direction L2, and the first extension direction L1 of the metal wire 130 is perpendicular to the second extension direction L2 of the substrate 10. The metal wire 130 and the metal wire bump 120 are integrally formed, and the metal wire bump 120 is connected between the metal wire 130 and the pad 110. As shown in FIG. 1B, an orthogonal projection of the metal wire bump 120 on the substrate 10 and an orthogonal projection of the pad 110 on the substrate 10 are completely overlapped, and an area of the orthogonal projection of the metal wire bump 120 on the substrate 10 is smaller than an area of the orthogonal projection of the pad 110 on the substrate 10. In the present embodiment, the metal wire 130 and the metal wire bump 120 formed by a wire bonding machine (not shown) are made of substantially the same material, and such material is, for instance, cooper, gold, silver, aluminum, nickel, tin, or an alloy of some or all of the above. A diameter D of the metal wire 130 is less than a width of the metal wire bump 120 and is within a range from 15 micrometers to 200 micrometers, for instance.

With reference to FIG. 1C, a plating process is performed to form a metal plating layer 140a with use of the pad 110, the metal wire bump 120, and the metal wire 130 as an plating seed layer, so as to cover the pad 110 and completely encapsulate the metal wire bump 120 and the metal wire 130. As shown in FIG. 1C, the metal plating layer 140a provided herein covers an upper surface 112 of the pad 110 and encapsulates a side surface 114 of the pad 110 connecting the upper surface 112, the metal wire bump 120, and the metal wire 130. That is, the metal plating layer 140a provided in the present embodiment is substantially formed along an outer profile of the pad 110, the metal wire bump 120, and the metal wire 130. In particular, a length L of the metal wire 130 is ⅘ a length H of the metal plating layer 140a in the present embodiment, and a material of the metal plating layer 140a is, for instance, copper, gold, silver, aluminum, nickel, tin, or an alloy of some or all of the above. After said steps are performed, the pillar structure 100a is formed.

Note that FIG. 1A to FIG. 1C schematically illustrate one pad 110, one metal wire bump 120, one metal wire 130, and one metal plating layer 140a for illustrative purposes. In other embodiments not shown herein, plural pads 110, plural metal wire bumps 120, plural metal wires 130, and plural metal plating layers 140a may be formed according to actual demands, as known to people skilled in the pertinent art, so as to form plural pillar structures 100a, which does not depart from the scope of protection provided herein.

As to the structure, with reference to FIG. 1C, the pillar structure 100a is disposed on the substrate 10. The pillar structure 100a includes a pad 110, a metal wire bump 120, a metal wire 130, and a metal plating layer 140a. The pad 110 is disposed on the substrate 10, and the metal wire bump 120 is disposed on the pad 110. The metal wire 130 and the metal wire bump 120 are integrally formed. An orthogonal projection of the metal wire bump 120 on the substrate 10 and an orthogonal projection of the pad 110 on the substrate 10 are completely overlapped, and an area of the orthogonal projection of the metal wire bump 120 on the substrate 10 is smaller than an area of the orthogonal projection of the pad 110 on the substrate 10. The metal wire 130 is connected to the metal wire bump 120. The metal wire 130 extends in a first extension direction L1, the substrate 10 extends in a second extension direction L2, and the first extension direction L1 is perpendicular to the second extension direction L2. A diameter D of the metal wire 130 is within a range from 15 micrometers to 200 micrometers, for instance. The metal plating layer 140a covers an upper surface 112 of the pad 110 and completely encapsulates a side surface 114 of the pad 110, the metal wire bump 120, and the metal wire 130. Here, a length L of the metal wire 130 is ⅘ a height H of the metal plating layer 140a.

In the present embodiment, the metal wire bump 120 and the metal wire 130 are formed on the pad 110 through wire bonding, and the metal plating layer 140a is then formed through plating with use of the pad 110, the metal wire bump 120, and the metal wire 130 as the plating seed layer, so as to form the pillar structure 110a. Hence, in the present embodiment, through applying the manufacturing method of the pillar structure, the pillar structure 100a made of metal can be formed efficiently, and the height of the resultant pillar structure 100a (i.e., the height H of the metal plating layer 140a) can be controlled by adjusting the length L of the metal wire 130. As a result, the pillar structure 100a formed by conducting the manufacturing method provided herein can have the consistent height. On the other hand, the length L of the metal wire 130 can also be adjusted according to the required height of the pillar structure 100a, which should not be construed as a limitation to the disclosure.

Figure 2A:
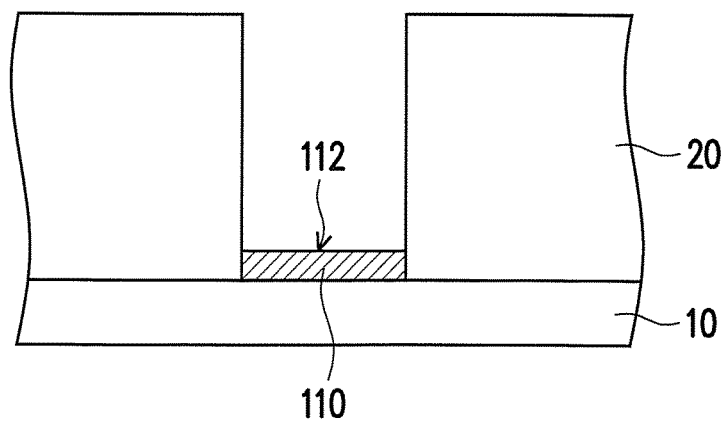
FIG. 2A to FIG. 2D are schematic cross-sectional diagrams illustrating some steps in a manufacturing method of a pillar structure according to another embodiment of the disclosure.

FIG. 2A to FIG. 2D are schematic cross-sectional diagrams illustrating some steps in a manufacturing method of a pillar structure according to another embodiment of the disclosure. The manufacturing method of the pillar structure provided in the present embodiment is similar to that depicted in FIG. 1A to FIG. 1C, while the difference therebetween lies in that a patterned photoresist layer 20 is formed on the substrate 10 (as shown in FIG. 2A) after the step of forming the pad 110 on the substrate 10 as depicted in FIG. 1A. Here, the patterned photoresist layer 20 merely exposes the upper surface 112 of the pad 110.

Figure 2B:
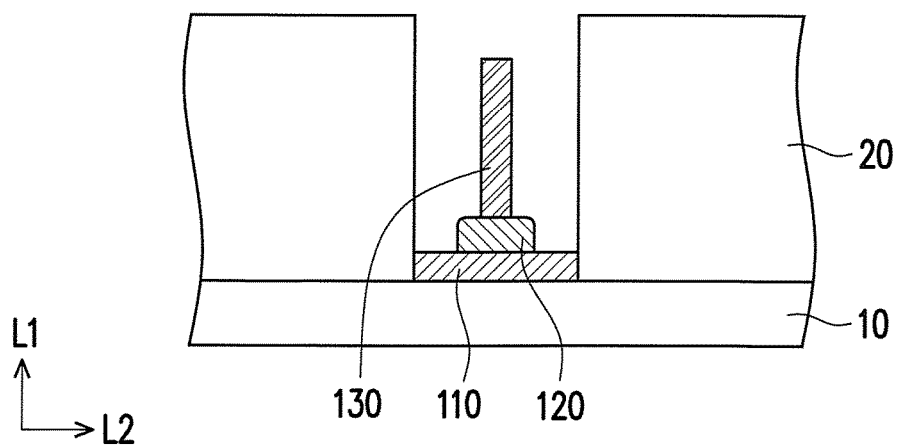

With reference to FIG. 2B, a wire bonding process is performed to form the metal wire bump 120 and the metal wire 130 on the pad 110. The metal wire bump 120 is located on the pad 110, the metal wire 130 is connected to the metal wire bump 120 and extends in a first extension direction L1, the substrate 10 extends in a second extension direction L2, and the first extension direction L1 of the metal wire 130 is perpendicular to the second extension direction L2 of the substrate 10. As shown in FIG. 2B, an orthogonal projection of the metal wire bump 120 on the substrate 10 and an orthogonal projection of the pad 110 on the substrate 10 are completely overlapped, and an area of the orthogonal projection of the metal wire bump 120 on the substrate 10 is smaller than an area of the orthogonal projection of the pad 110 on the substrate 10.

In the present embodiment, the metal wire 130 and the metal wire bump 120 formed by a wire bonding machine (not shown) are made of substantially the same material, and such material is, for instance, cooper, gold, silver, aluminum, nickel, tin, or an alloy of some or all of the above. A diameter D of the metal wire 130 is less than a width of the metal wire bump 120 and is within a range from 15 micrometers to 200 micrometers, for instance.

Figure 2C:
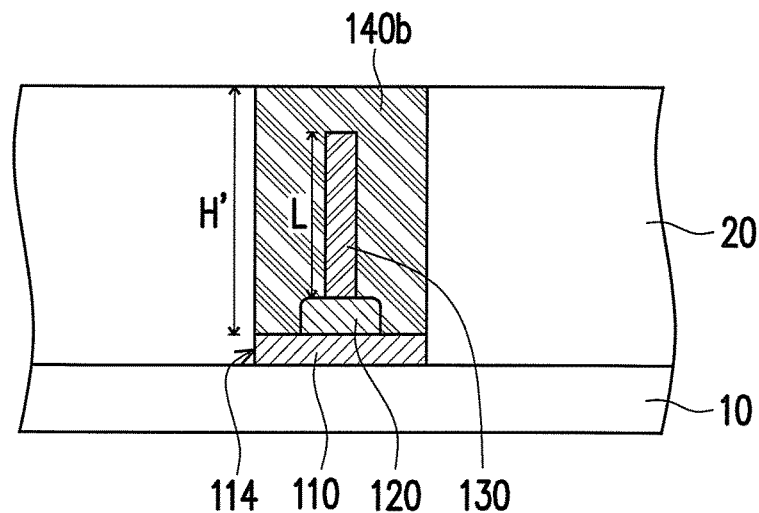

With reference to FIG. 2C, a plating process is performed to foam the metal plating layer 140b with use of the pad 110, the metal wire bump 120, and the metal wire 130 as the plating seed layer and with use of the patterned photoresist layer 20 as a plating mask, so as to cover the pad 110 and completely encapsulate the metal wire bump 120 and the metal wire 130. As shown in FIG. 2C, the metal plating layer 140b provided herein covers the upper surface 112 of the pad 110 and encapsulates the metal wire bump 120 and the metal wire 130. Namely, the metal plating layer 140b provided in the present embodiment does not encapsulate the side surface 114 of the pad 110. In particular, the length L of the metal wire 130 is ⅘ the length H' of the metal plating layer 140b in the present embodiment, and a material of the metal plating layer 140b is, for instance, copper, gold, silver, aluminum, nickel, tin, or an alloy of some or all of the above.

Figure 2D:
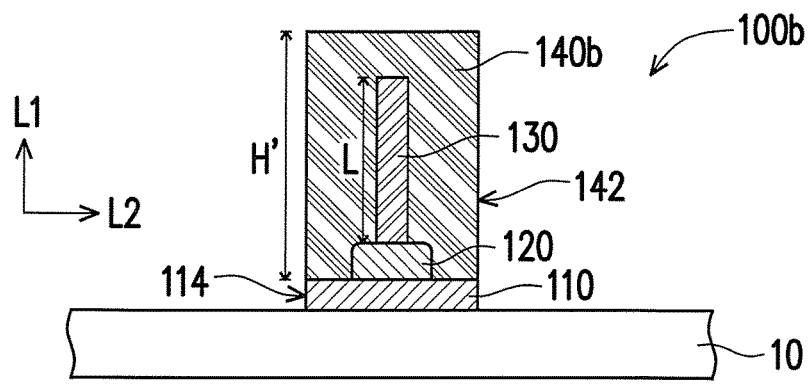

With reference to FIG. 2D, the patterned photoresist layer 20 is removed to expose an edge of the metal plating layer 140b, wherein the edge of the metal plating layer 140b is aligned to the side surface 114 of the pad 110. So far, the package structure 100b is completely formed.

Note that FIG. 2A to FIG. 2D schematically illustrate one pad 110, one metal wire bump 120, one metal wire 130, and one metal plating layer 140b for illustrative purposes. In other embodiments not shown herein, plural pads 110, plural metal wire bumps 120, plural metal wires 130, and plural metal plating layers 140b may be formed according to actual demands, as known to people skilled in the pertinent art, so as to form plural pillar structures 100b, which does not depart from the scope of protection provided herein.

As to the structure, with reference to FIG. 2D, the pillar structure 100b is disposed on the substrate 10. The pillar structure 100b includes a pad 110, a metal wire bump 120, a metal wire 130, and a metal plating layer 140b. The pad 110 is disposed on the substrate 10, and the metal wire bump 120 is disposed on the pad 110. An orthogonal projection of the metal wire bump 120 on the substrate 10 and an orthogonal projection of the pad 110 on the substrate 10 are completely overlapped, and an area of the orthogonal projection of the metal wire bump 120 on the substrate 10 is smaller than an area of the orthogonal projection of the pad 110 on the substrate 10. The metal wire 130 is connected to the metal wire bump 120. The metal wire 130 extends in a first extension direction L1, the substrate 10 extends in a second extension direction L2, and the first extension direction L1 is perpendicular to the second extension direction L2. A diameter D of the metal wire 130 is within a range from 15 micrometers to 200 micrometers, for instance. The metal plating layer 140b covers an upper surface 112 of the pad 110 and completely encapsulates the metal wire bump 120 and the metal wire 130, and an edge 142 of the metal plating layer 140 is aligned to a side surface 114 of the pad 110. Here, a length L of the metal wire 130 is ⅘ a height H' of the metal plating layer 140b.

In the present embodiment, the patterned photoresist layer 20 that exposes the upper surface 112 of the pad 110 is formed on the substrate 10, the metal wire bump 120 and the metal wire 130 are formed on the pad 110 through wire bonding, and the metal plating layer 140b is then formed through plating with use of the pad 110, the metal wire bump 120, and the metal wire 130 as the plating seed layer, so as to form the pillar structure 110b. Hence, in the present embodiment, through applying the manufacturing method of the pillar structure, the pillar structure 100b made of metal can be formed efficiently, and the height of the resultant pillar structure 100b (i.e., the height H' of the metal plating layer 140b) and the width of the resultant pillar structure 100b can be controlled by adjusting the length L of the metal wire 130 and the patterned photoresist layer 20. As a result, the pillar structure 100b formed by conducting the manufacturing method provided herein can have the consistent height and the consistent outer profile.

To sum up, the metal wire bump and the metal wire are formed on the pad through wire bonding, and the metal plating layer is then formed through plating with use of the pad, the metal wire bump, and the metal wire as the plating seed layer, so as to form the pillar structure. Through applying the manufacturing method of the pillar structure provided herein, the pillar structure made of metal can be formed efficiently, and the height of the resultant pillar structure can be controlled by adjusting the length of the metal wire. As a result, the pillar structure formed by conducting the manufacturing method provided herein can have the consistent height and can be characterized by simple production and low manufacturing costs.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A pillar structure disposed on a substrate and comprising:
    a pad disposed on the substrate;
    a metal wire bump disposed on the pad;
    a metal wire connected to the metal wire bump, the metal wire and the metal wire bump being integrally formed, wherein the metal wire extends in a first extension direction having a consistent diameter, the substrate extends in a second extension direction, and the first extension direction is perpendicular to the second extension direction, wherein a diameter of the metal wire is less than a width of the metal wire bump; and
    a metal plating layer covering the pad and completely encapsulating the metal wire bump and the metal wire, wherein a length of the metal wire is ⅘ a length of the metal plating layer, and the metal plating layer covers an upper surface of the pad and encapsulates a side surface of the pad connecting the upper surface.

2. The pillar structure as recited in claim 1, wherein an orthogonal projection of the metal wire bump on the substrate and an orthogonal projection of the pad on the substrate are completely overlapped, and an area of the orthogonal projection of the metal wire bump on the substrate is smaller than an area of the orthogonal projection of the pad on the substrate.

3. The pillar structure as recited in claim 1, wherein a diameter of the metal wire is within a range from 15 micrometers to 200 micrometers.

4. A manufacturing method of a pillar structure, comprising:

forming a pad on a substrate;

performing a wire bonding process to form a metal wire bump and a metal wire on the pad, wherein the metal wire bump is located on the pad, the metal wire is connected to the metal wire bump and extends in a first extension direction having a consistent diameter, the metal wire and the metal wire bump are integrally formed, the substrate extends in a second extension direction, and the first extension direction of the metal wire is perpendicular to the second extension direction of the substrate, wherein a diameter of the metal wire is less than a width of the metal wire bump; and performing a plating process to form a metal plating layer with use of the pad, the metal wire bump, and the metal wire as an plating seed layer, so as to cover the pad and completely encapsulate the metal wire bump and the metal wire, wherein a length of the metal wire is ⅘ a length of the metal plating layer, and the metal plating layer covers an upper surface of the pad and encapsulates a side surface of the pad connecting the upper surface.

5. The manufacturing method of the pillar structure as recited in claim 4, wherein an orthogonal projection of the metal wire bump on the substrate and an orthogonal projection of the pad on the substrate are completely overlapped, and an area of the orthogonal projection of the metal wire bump on the substrate is smaller than an area of the orthogonal projection of the pad on the substrate.

6. The manufacturing method of the pillar structure as recited in claim 4, wherein a diameter of the metal wire is within a range from 15 micrometers to 200 micrometers.

* * * * *